(12) United States Patent
Kim et al.

(10) Patent No.: US 10,074,801 B2
(45) Date of Patent: Sep. 11, 2018

(54) RESISTIVE RANDOM ACCESS MEMORY DEVICE

(71) Applicant: SK hynix Inc., Icheon (KR)

(72) Inventors: Hyung Woo Kim, Yongin (KR); Tae Jung Ha, Icheon (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 15/433,981

(22) Filed: Feb. 15, 2017

(65) Prior Publication Data

US 2017/0358743 A1    Dec. 14, 2017

(30) Foreign Application Priority Data

Jun. 8, 2016   (KR) .......................... 10-2016-0071347

(51) Int. Cl.
*H01L 45/00*    (2006.01)

(52) U.S. Cl.
CPC ........ *H01L 45/085* (2013.01); *H01L 45/1233* (2013.01); *H01L 45/1266* (2013.01); *H01L 45/142* (2013.01); *H01L 45/143* (2013.01); *H01L 45/144* (2013.01); *H01L 45/146* (2013.01)

(58) Field of Classification Search
None
See application file for complete search history.

(56) References Cited

U.S. PATENT DOCUMENTS

| | | | |
|---|---|---|---|
| 9,058,865 B1 | 6/2015 | Jo et al. | |
| 2009/0072217 A1* | 3/2009 | Klostermann | H01L 27/2463 257/4 |
| 2013/0228734 A1 | 9/2013 | Venkatasamy et al. | |
| 2013/0306930 A1* | 11/2013 | Sills | H01L 45/085 257/4 |
| 2014/0036570 A1* | 2/2014 | Lee | G11C 13/0004 365/148 |

* cited by examiner

*Primary Examiner* — Khaja Ahmad

(57) ABSTRACT

A resistive random access memory device is provided. The resistive random access memory device includes a first electrode, a second electrode, and an electrolyte layer disposed between the first electrode and the second electrode. One of the first electrode and the second electrode includes an ion supply layer providing two or more kinds of metal ions to the electrolyte layer. The two or more kinds of metal ions have different mobilities in the electrolyte layer. Two or more conductive bridges are generated by the two or more kinds of metal ions, respectively.

10 Claims, 14 Drawing Sheets

RESISTIVE RANDOM ACCESS MEMORY DEVICE

CROSS-REFERENCE TO RELATED APPLICATION

The present application claims priority under 35 U.S.C 119(a) to Korean Patent Application No. 10-2016-0071347, filed on Jun. 8, 2016, which is herein incorporated by reference in its entirety.

BACKGROUND

1. Technical Field

Various embodiments of the present disclosure generally relate to a resistive random access memory device.

2. Related Art

A resistive random access memory device refers to a device in which different data is stored according to resistance states thereof, the resistance states changing according to resistance variation in a nonvolatile memory material layer disposed in each unit cell.

The resistive random access memory device may be categorized into one of various types according to a method of inducing the resistance variation in the nonvolatile memory material layer. The method of inducing the resistance variation can be, for example, a method to control generation of conductive bridges in the memory material layer by the movement of metal ions, positive ions, or oxygen cavities; a method to control generation of an interface oxide material layer between the nonvolatile memory material layer and an electrode layer according to the movement of negative ions; a method to generate trap sites in the nonvolatile memory material layer and to capture or conduct conductive carriers, or the like.

SUMMARY

Various embodiments are directed to a resistive random access memory device capable of reliably storing an electric signal having a plurality of levels in a unit cell.

According to an embodiment, there is provided a resistive random access memory device. The resistive random access memory device may include a first electrode and a second electrode, and an electrolyte layer disposed between the first electrode and the second electrode. One of the first electrode and the second electrode includes an ion supply layer providing two or more kinds of metal ions to the electrolyte layer. The two or more kinds of metal ions have different mobilities in the electrolyte layer. Two or more conductive bridges are generated by the two or more kinds of metal ions, respectively.

According to another embodiment, there is provided a resistive random access memory device. The resistive random access memory device may include a first electrode and a second electrode, and an electrolyte layer disposed between the first electrode and the second electrode. The electrolyte layer includes first metal ions. One of the first electrode and the second electrode includes an ion supply layer providing second metal ions to the electrolyte layer. The second metal ions are a different kind of metal ions from the first metal ions. When an external voltage is applied, two or more conductive bridges are sequentially generated at different threshold voltages by the first metal ions and the second metal ions.

According to another embodiment, there is provided a resistive random access memory device. The resistive random access memory device may include a first electrode and a second electrode, and an electrolyte layer disposed between the first electrode and the second electrode. One of the first electrode and the second electrode includes an ion supply layer providing two or more kinds of metal ions to the electrolyte layer. One or more of the first electrode and the second electrode respectively includes a plurality of sub-electrode layers that are laterally spaced apart from each other on the same plane. The two or more kinds of metal ions are arranged to generate two or more conductive bridges in the electrolyte layer, respectively. The two or more kinds of metal ions have different mobilities in the electrolyte layer.

BRIEF DESCRIPTION OF THE DRAWINGS

Various embodiments of the present disclosure will become more apparent in view of the attached drawings and accompanying detailed description, in which.

DETAILED DESCRIPTION

Figure 1:
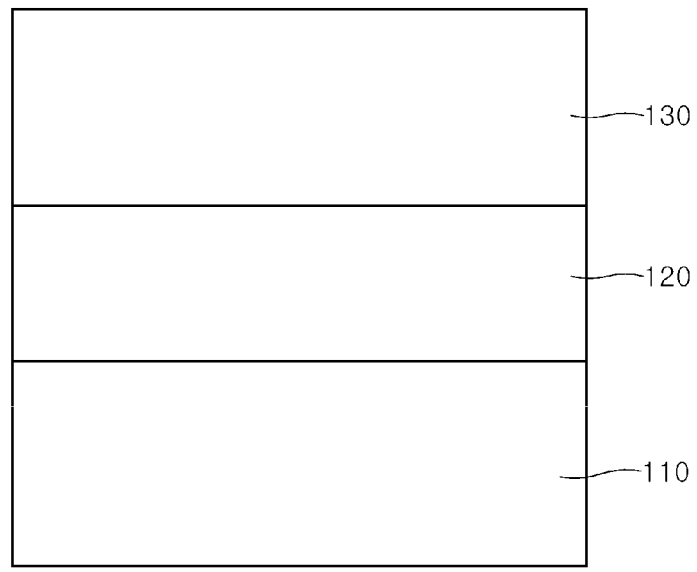
FIG. 1 is a view illustrating a resistive random access memory device according to a first embodiment of the present disclosure.

Various embodiments will now be described hereinafter with reference to the accompanying drawings. In the drawings, the dimensions of layers and regions may be exaggerated for clarity of illustration. The drawings are described in the observer's point overall, if an element is referred to be located on another element, it may be understood that the element is directly located on the other element, or an additional element may be interposed between the element and the other element. The same reference numerals refer to the same elements throughout the specification.

In addition, expression of the singular form should be understood to include the plural forms unless clearly used otherwise in the context. It will be understood that the terms "comprise" or "have" are intended to specify the presence of a feature, a number, a step, an operation, an element, a part or combinations thereof, but not used to preclude the presence or possibility of addition one or more other features, numbers, steps, operations, components, parts or combinations thereof.

Further, in performing a method or a manufacturing method, each process constituting the method can take place differently from the stipulated order unless a specific sequence is described explicitly in the context. In other words, each process may be performed in the same manner as stated order, may be performed substantially at the same time, or may be performed in a reverse order.

FIG. 1 is a view illustrating a resistive random access memory device 10 according to a first embodiment of the present disclosure. Referring to FIG. 1, the resistive random access memory device 10 may include a first electrode 110, a second electrode 130, and an electrolyte layer 120 disposed between the first electrode 110 and the second electrode 130. In an embodiment, the first electrode 110, the electrolyte layer 120, and the second electrode 130 may constitute a unit cell of the resistive random access memory device 10.

The electrolyte layer 120 may function as a variable resistance layer of which a resistance state varies according to a value of a voltage externally applied to the electrolyte layer 120. The electrolyte layer 120 may include an oxide material or a chalcogenide group compound. In an embodiment, the electrolyte layer 120 may include a silicon oxide material, an aluminum oxide material, a titanium oxide material, a tantalum oxide material, a copper oxide material, a zirconium oxide material, a gadolinium oxide material, or a combination thereof. In another embodiment, the electrode layer 120 may include a GeS material, a GeTe material, a GeTeAs material, a GeSe material, a CuS material, a CuSe material, a CuTe material, a CuTeAs material, or a combination thereof.

One of the first and second electrodes 110 and 130 may include an ion supply layer (not illustrated). In an embodiment, when the first electrode 110 includes the ion supply layer, the first electrode 110 may be configured to be a single ion supply layer, or a stacked double layer including the ion supply layer. In another embodiment, when the second electrode 130 includes the ion supply layer, the second electrode 130 may be configured to be a single ion supply layer, or a stacked double layer including the ion supply layer.

In an embodiment, when the external voltage is applied to the ion supply layer, the ion supply layer can provide two or more different kinds of metal ions to the electrolyte layer 120. The two or more different kinds of metal ions may move with different mobilities in the electrolyte layer 120 when an electric field is formed by the external voltage. At this time, the mobility of each of the two or more different kinds of metal ions may be inversely proportional to its mass. This is because the acceleration of the metal ion moving within the electric field is inversely proportional to the mass of the metal ion.

In an embodiment, the ion supply layer may include a binary alloy having two different kinds of metal elements. Accordingly, the ion supply layer may provide two different kinds of metal ions to the electrolyte layer 120. In an embodiment, the binary alloy may include a silver-copper alloy, a copper-aluminum alloy, a copper-titanium alloy, a copper-nickel alloy, a silver-aluminum alloy, a silver-titanium alloy, a silver-nickel alloy, or a combination thereof.

In an embodiment, the two different kinds of metal ions may form first and second conductive bridges at different threshold voltages due to their different mobilities within the electrolyte layer 120. The first and second conductive bridges may electrically connect the first and second electrodes to each other.

For example, when the externally applied voltage reaches a first threshold voltage, the first conductive bridge may be formed in the electrolyte layer 120 by a first kind of metal ions having a relatively high mobility. When the first conductive bridge is formed, a resistance value of the electrolyte layer 120 may be decreased, and thus a resistance state of the electrolyte layer 120 may be changed from a high resistance state at an initial time to a first low resistance state by the first conductive bridge.

After that, if the external voltage continuously increases and then reaches a second threshold voltage, the second conductive bridge may be additionally formed by a second kind of metal ions having a relatively low mobility. In this embodiment, the second kind of metal ions have a lower mobility than the first kind of metal ions, and the second threshold voltage has a higher value than the first threshold voltage. When the second conductive bridge is formed, the resistance value of the electrolyte layer 120 may be additionally decreased by the second conductive bridge, and thus the resistance state of the electrolyte layer 120 may be changed into a second low resistance state from the first low resistance state.

In accordance with this operation, the electrolyte layer 120 may have different resistance values when it switches between the high resistance state, the first low resistance state, and the second low resistance state. As a result, a data signal having a plurality of bits can be stored in the electrolyte layer 120 by the different resistance values of the electrolyte layer 120 that are implemented according to whether the first and second conductive bridges are formed.

In some other embodiments, the ion supply layer may include any of various kinds of alloys to provide three or more different kinds of metal ions. Even in this case, three or more conductive bridges may be formed at different threshold voltages according to the mobility of each of the three or more different kinds of metal ions.

Referring back to FIG. 1, a counter electrode may be disposed at one side of the electrolyte layer 120 when the electrode including the ion supply layer is disposed at the other side of the electrolyte layer 120. In an embodiment, when the first electrode 110 includes the ion supply layer, the second electrode 130 may be the counter electrode. In another embodiment, when the second electrode 130 includes the ion supply layer, the first electrode 110 may be the counter electrode.

The counter electrode may include a metal material, a nitride material, a conductive oxide material, or the like. In an embodiment, the counter electrode may include gold (Au), platinum (Pt), copper (Cu), silver (Ag), ruthenium (Ru), titanium (Ti), iridium (Ir), tungsten (W), titanium nitride (TiN), or tantalum nitride (TaN).

Figure 2:
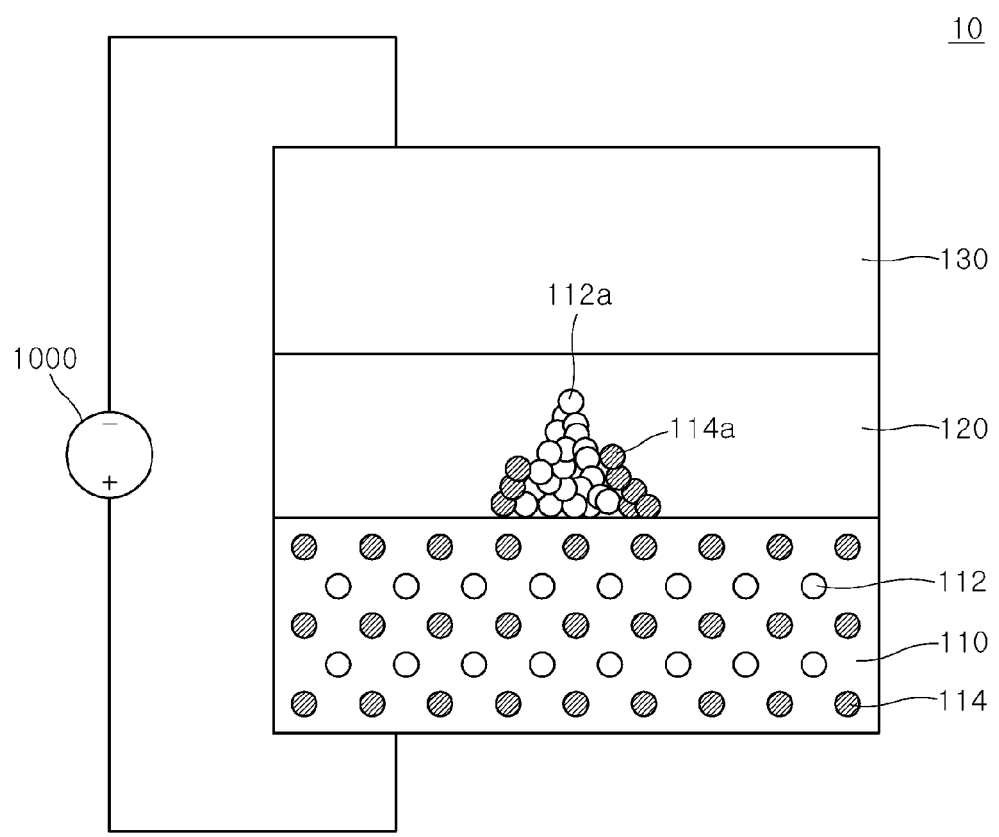
FIGS. 2 to 4 are views illustrating an operating method of the resistive random access memory device according to the first embodiment of the present disclosure.
Figure 3:
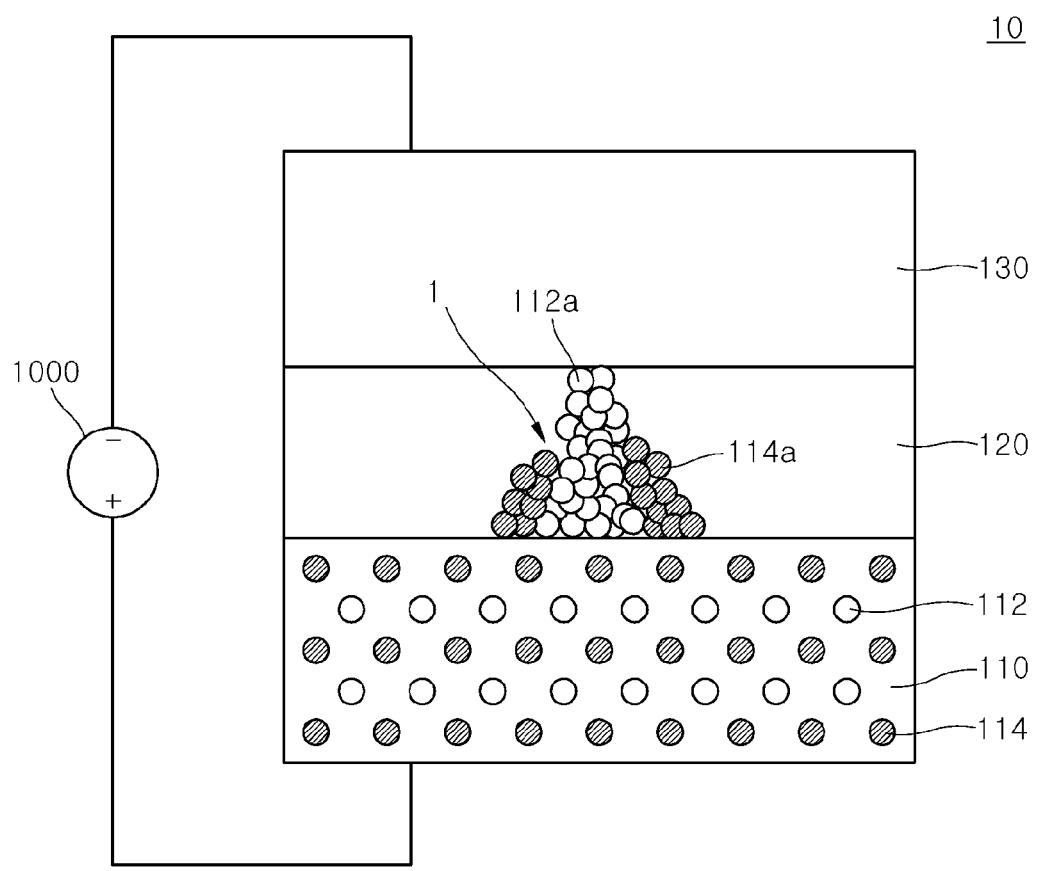
Figure 4:
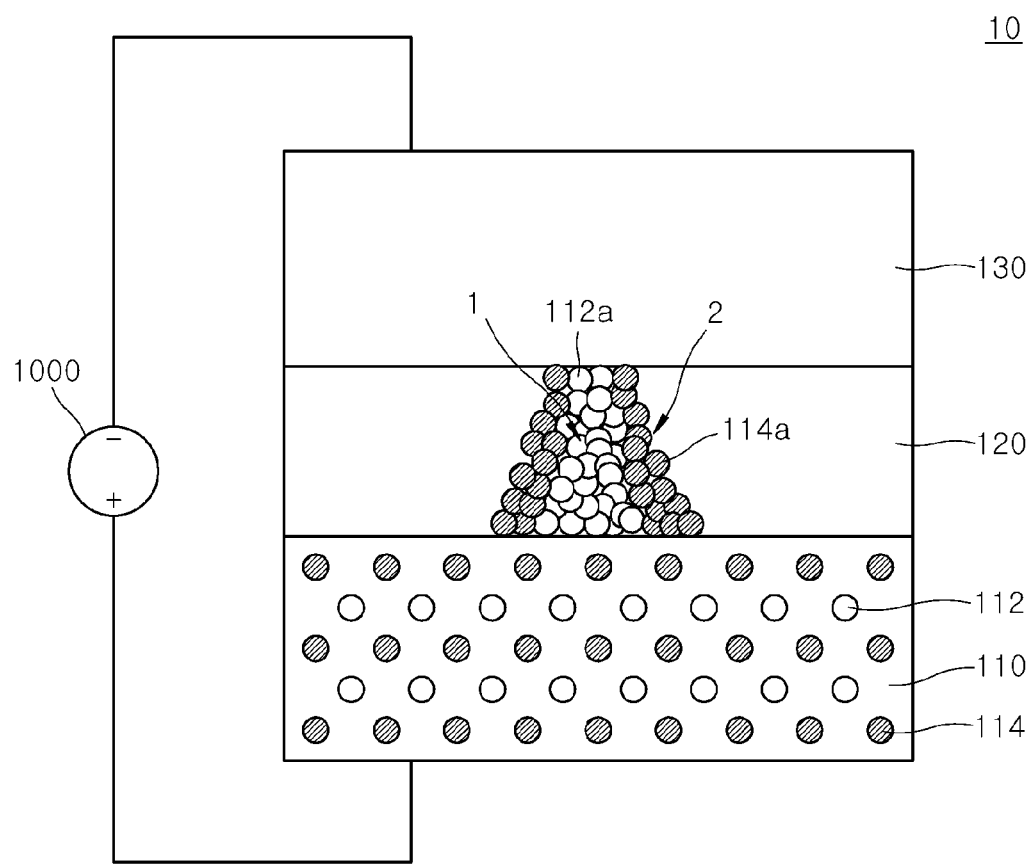

FIGS. 2 to 4 are views illustrating an operating method of the resistive random access memory device 10 according to the first embodiment of the present disclosure. In this embodiment, the first electrode 110 includes the ion supply layer, and the second electrode 130 is the counter electrode. However, embodiments are not limited thereto. The operating method shown in FIGS. 2 to 4 may be similarly applied to an embodiment in which the second electrode 130 includes the ion supply layer and the first electrode 110 is the counter electrode.

In the embodiment shown in FIG. 2, the first electrode 110 includes a single layer, i.e., the ion supply layer, but embodiments are not limited thereto. In another embodiment, the first electrode 110 may have a stacked structure including the ion supply layer and at least one conductive layer coupled to the ion supply layer. Meanwhile, in FIG. 2, the ion supply layer 110 includes a first metal element 112 and a second metal element 114 that are different kinds of metal elements, but embodiments are not limited thereto. In other embodiments, the ion supply layer 110 may include three or more different kinds of metal elements.

Referring to FIG. 2, a voltage may be applied between the first electrode 110 and the second electrode 130 by an external power supply 1000. More specifically, when a positive bias is applied to the first electrode 110 and a negative bias is applied to the second electrode 130, the ion supply layer 110 may provide the first and second metal elements 112 and 114 to the electrolyte layer 120 in positive ion forms. In this embodiment, first metal ions 112a of the first metal elements 112 may have a higher mobility in the electrolyte layer 110 than second metal ions 114a of the second metal elements 114. Each of the first metal ions 112a may have a smaller mass than each of the second metal ions 114a. Accordingly, when an electric field is formed by the externally applied voltage, the acceleration of the first metal ion 112a moving within the electric field may be greater than the acceleration of the second metal ion 114a.

Referring back to FIG. 2, the first and second metal ions 112a and 114a may be arranged from an interface between the ion supply layer 110 and the electrolyte layer 120 toward the second electrode 130 along the electric field. In an embodiment, when the mobility of the first metal ion 112a is greater than the mobility of the second metal ion 114a, the speed of the first metal ion 112a through the electrolyte layer 120 is higher than of the speed of the second metal ion 114a.

Referring to FIG. 3, when the externally applied voltage increases and reaches a first threshold voltage, the first metal ions 112a are arranged across the electrolyte layer 120 in a direction from the first electrode 110 to the second electrode 130, thereby forming a first conductive bridge 1. In this case, the first metal ions 112a may constitute the first conductive bridge 1 in the form of a cluster of ions. Alternatively, after the first metal ions 112a are reduced into metal atoms, the first conductive bridge 1 may be formed with the metal atoms.

The first conductive bridge 1 may generate a path through which conductive carriers such as electrons or holes move between the ion supply layer 110 and the second electrode 130. At this time, the second metal ion 114a having a relatively small mobility cannot yet form a conductive bridge at the first threshold voltage. Meanwhile, as the first conductive bridge 1 is formed, a resistance value of the electrolyte layer 120 may be reduced, and thus the resistance state of the electrolyte layer 120 may be changed from an initial high resistance state to a first low resistance state.

Referring to FIG. 4, when the externally applied voltage increases beyond the first threshold voltage and reaches a second threshold voltage, the second metal ions 114a are arranged across the electrolyte layer 120 in the direction from the first electrode 110 to the second electrode 130, thereby forming a second conductive bridge 2. At this time, the second metal ions 114a may constitute the second conductive bridge 2 in the form of a cluster of ions. Alternatively, after the second metal ions 114a are reduced into metal atoms 114, the second conductive bridge 2 may be formed with the metal atoms. The second conductive bridge 2 may generate an additional path through which conductive carriers move between the first electrode 110 and the second electrode 130. As the second conductive bridge 2 is formed, the resistance value of the electrolyte layer 120 may be additionally reduced, and thus the resistance state of the electrolyte layer 120 may be changed from the first low resistance state to a second low resistance state.

As illustrated in FIG. 4, the second conductive bridge 2 may be coupled to the first conductive bridge 1. In another embodiment, the second conductive bridge 2 may be formed to be separate from the first conductive bridge 1.

As described above, the electrolyte layer 120 has the high resistance state when the externally applied voltage is lower than the first threshold voltage, has the first low resistance state when the externally applied voltage is equal to or higher than the first threshold voltage and lower than the second threshold voltage, and has the second low resistance state when the externally applied voltage is equal to or higher than the second threshold voltage. The resistance value of the electrolyte layer 120 may decrease in an order of the high resistance state, the first low resistance state, and the second low resistance state.

As described above, the resistance value of the electrolyte layer 120 may be changed depending on whether the first and second conductive bridges 1 and 2 are generated or not. Accordingly, the electrolyte layer 120 may be easily implemented to have a plurality of resistance levels that are identified from each other by controlling the generation of the first and second conductive bridges 1 and 2 using the externally applied voltage. As a result, the resistive random access memory device 10 reliably storing a plurality of data in a unit cell can be provided.

Meanwhile, although it is not illustrated in FIG. 4, in the second low resistance state, the power supply 1000 may apply a voltage between the first electrode 110 and the second electrode 130 with a polarity opposite to the polarity shown in FIGS. 2 to 4. More specifically, a negative bias may be applied to the first electrode 110, and a positive bias may be applied to the second electrode 130. If the externally applied voltage increases from 0 V and is applied between the first electrode 110 and the second electrode 130 in the opposite polarity direction, the first conductive bridge 1 may be cut off locally. Accordingly, the resistance value of the electrolyte layer 120 may be increased, and thus the resistance state of the electrolyte layer 120 may be changed from the second low resistance state to the first low resistance state. As the externally applied voltage continuously increases, the second conductive bridge 2 may also be cut off locally. Accordingly, when the resistance value of the electrolyte layer 120 is additionally increased, the resistance state of the electrolyte layer 120 may be changed from the first low resistance state to the high resistance state.

As described above, when the voltage applied between the first electrode 110 and the second electrode 130 increases and changes polarity, the first and second conductive bridges 1 and 2 may be formed or cut off sequentially. Accordingly, a plurality of data can be stored as a corresponding resistance value of the electrolyte layer 120 that is changed in sequence. As a result, a nonvolatile resistive random access memory device that stores a plurality of bits in a unit cell can be implemented.

Figure 5:
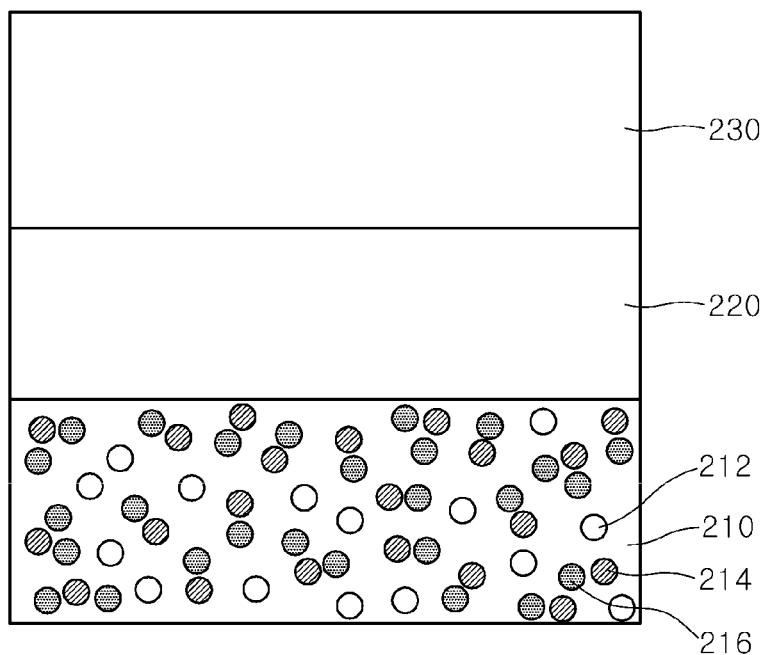
FIG. 5 is a view illustrating a resistive random access memory device according to a second embodiment of the present disclosure.
Figure 6:
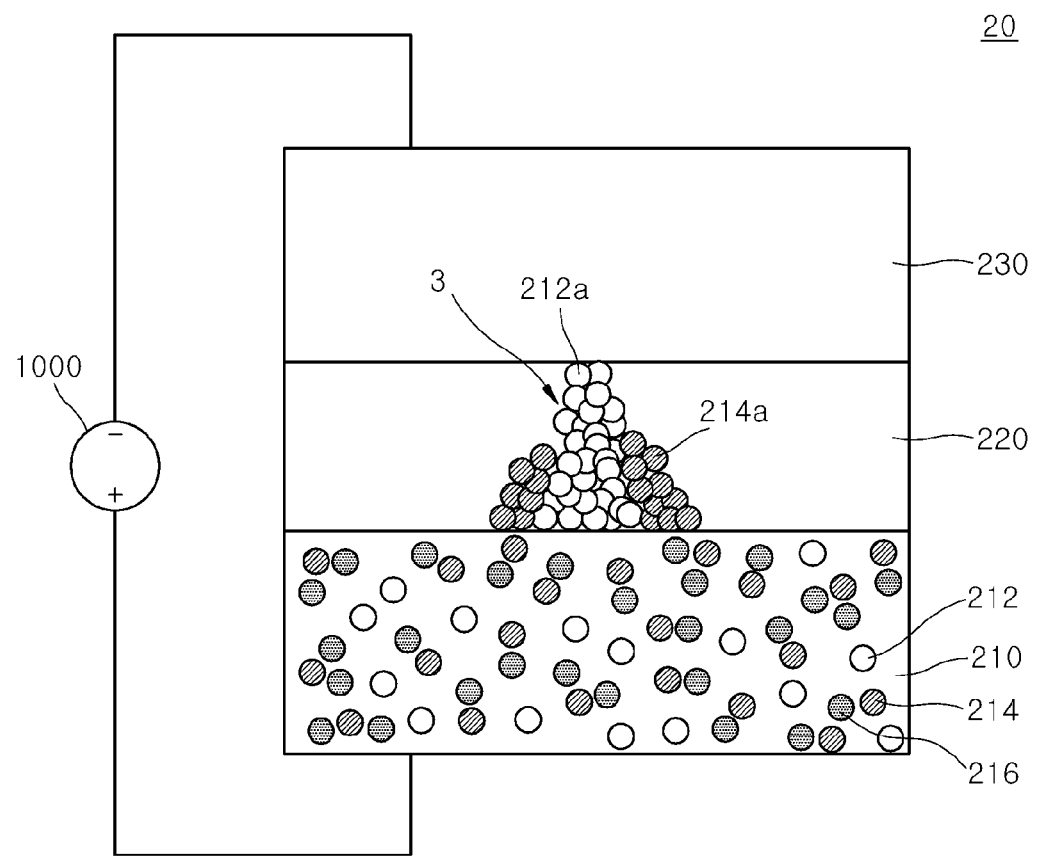
FIGS. 6 and 7 are views illustrating an operating method of the resistive random access memory device according to the second embodiment of the present disclosure.
Figure 7:
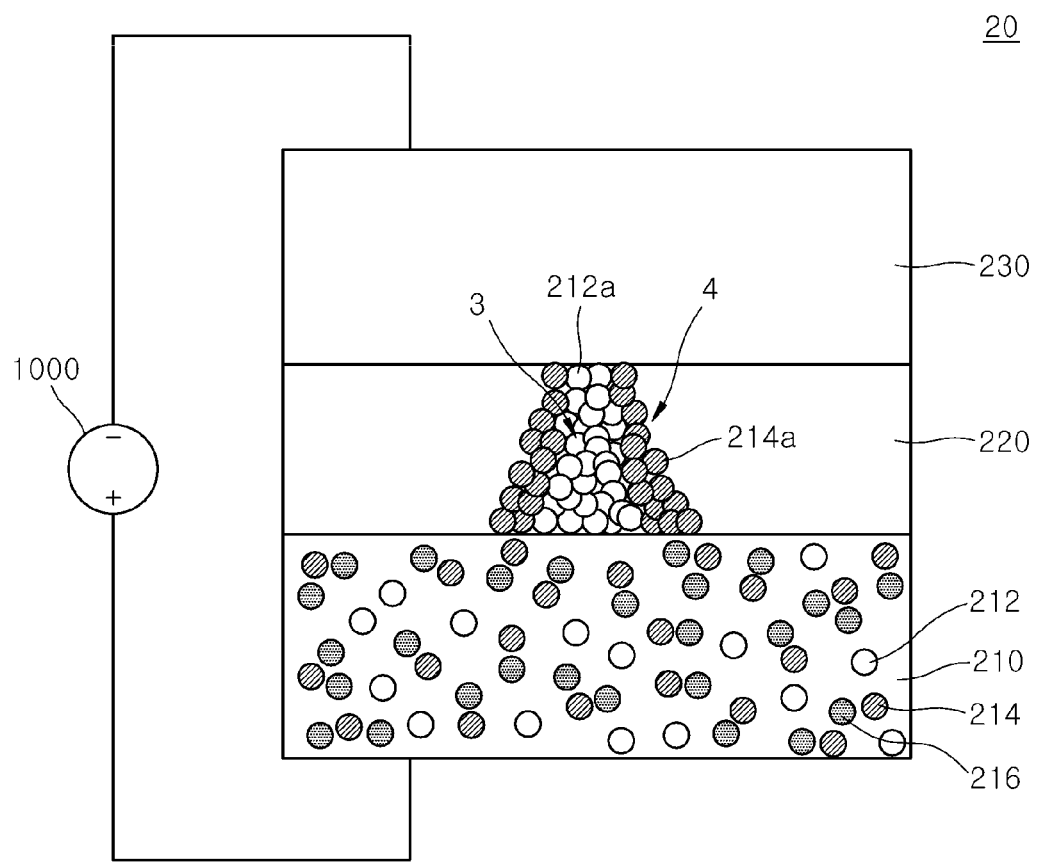

FIG. 5 is a view illustrating a resistive random access memory device 20 according to a second embodiment of the present disclosure. FIGS. 6 and 7 are views illustrating an operating mechanism of the resistive random access memory device 20 according to the second embodiment of the present disclosure.

Referring to FIG. 5, the resistive random access memory device 20 may include a first electrode 210, a second electrode 230, and an electrolyte layer 220 disposed between the first electrode 210 and the second electrode 230. In an embodiment, the first electrode 210, the electrolyte layer 220, and the second electrode 230 may constitute a unit cell of the resistive random access memory device 20.

The resistive random access memory device 20 may have a configuration that is substantially the same as the configuration of the resistive random access memory device 10 of the above-described first embodiment except for a configuration of the first electrode 210 including an ion supply layer. In this embodiment, configurations of the electrolyte layer 220 and the second electrode 230 are substantially the same as the configurations of the electrolyte layer 120 and the second electrode 130 of the first embodiment.

Referring to FIG. 5, the first electrode 210 is configured to include a single layer, i.e., the ion supply layer, but embodiments are not limited thereto. In other embodiments, the first electrode 210 may have a stacked structure including the ion supply layer and at least one conductive layer coupled to the ion supply layer.

The ion supply layer 210 may include two different kinds of metal elements 212 and 214 and a chalcogenide element 216. In an embodiment, the ion supply layer 210 may include a binary alloy that includes the two different kinds of metal elements 212 and 214, and the chalcogenide element 216 disposed in the binary alloy. In an embodiment, the chalcogenide element 216 may include sulfide (S), selenium (Se), tellurium (Te), or the like. One of the two kinds of metal elements 212 and 214 may have a greater coupling force with the chalcogenide element 216 compared to the other. The ion supply layer 210 may include AgCuTe.

Referring to FIG. 6, a voltage may be applied between the first electrode 210 and the second electrode 230 by the power supply 1000. More specifically, when a positive bias is applied to the first electrode 210 and a negative bias is applied to the second electrode 230, the metal element 214, which has a greater coupling force with the chalcogenide element 216 than the metal element 212, may be relatively suppressed to diffuse into the electrolyte layer 220 in contrast to the metal element 212.

Accordingly, when the applied voltage increases and reaches a first threshold voltage, first metal ions 212a of the metal element 212, which have a smaller coupling force with the chalcogenide element 216 than the metal element 214, may form a first conductive bridge 3 in the form of a cluster of the first metal ions 212a, or the first conductive bridge 3 may be formed with metal atoms reduced from the first metal ions 212a. The second metal ions 214a of the metal element 214, which have a greater coupling force with the chalcogenide element 216 than the metal element 212, cannot yet form a conductive bridge at the first threshold voltage. As the first conductive bridge 3 is formed, a resistance value of the electrolyte layer 220 may be reduced, and thus a resistance state of the electrolyte layer 220 may be changed from an initial high resistance state to a first low resistance state.

Referring to FIG. 7, when the applied voltage increases beyond the first threshold voltage and reaches a second threshold voltage, the second metal ions 214a, which have the greater coupling force with the chalcogenide element 216, may form a second conductive bridge 4 in the electrolyte layer 220 in the form of a cluster of the second metal ions 214a, or the second conductive bridge 4 may be formed with metal atoms reduced from the second metal ions 214a. As the second conductive bridge 4 is formed, the resistance value of the electrolyte layer 220 may be additionally decreased, and thus the resistance state of the electrolyte layer 220 may be changed from the first low resistance state to a second low resistance state.

According to some embodiments, the mobility of the first metal ion 212a in the electrolyte layer 220 may be greater than the mobility of the second metal ion 214a in the electrolyte layer 220. Therefore, in the present embodiment, when the ion supply layer 210 further includes the chalcogenide element 216, and when the second metal ion 214a has a greater coupling force with the chalcogenide element 216 than the first metal ion 212a, a voltage difference between the first threshold voltage at which the first conductive bridge 3 is generated and the second threshold voltage at which the second conductive bridge 4 is generated may be additionally increased compared to the first embodiment in which the ion supply layer 110 includes the first and second metal elements 112 and 114 only without a chalcogenide element. As a result, when performing a programming operation or a read operation for a plurality of resistance values, a programming or reading margin of the applied voltage can be improved.

Figure 8:
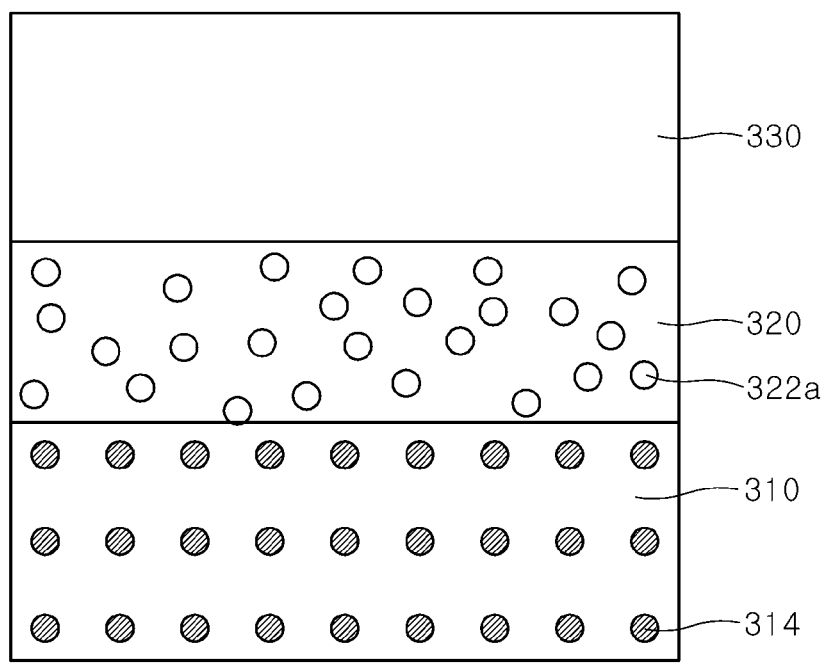
FIG. 8 is a view illustrating a resistive random access memory device according to a third embodiment of the present disclosure.
Figure 9:
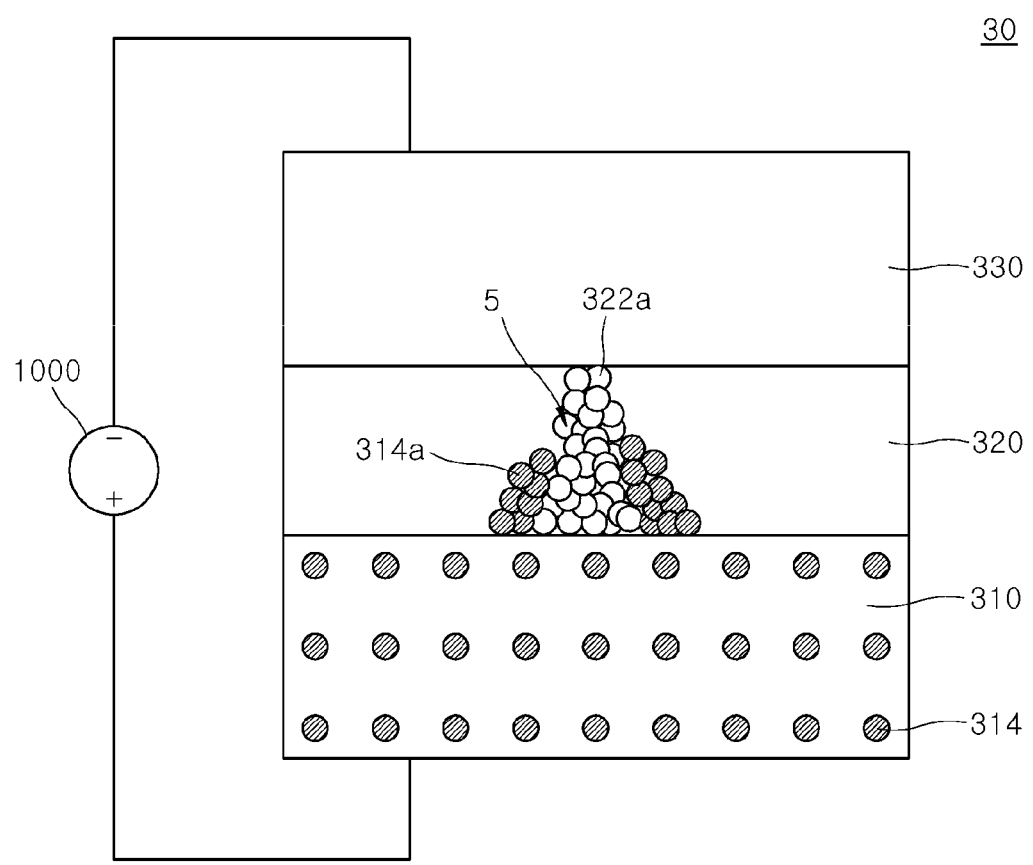
FIGS. 9 and 10 are views illustrating an operating method of the resistive random access memory device according to the third embodiment of the present disclosure.
Figure 10:
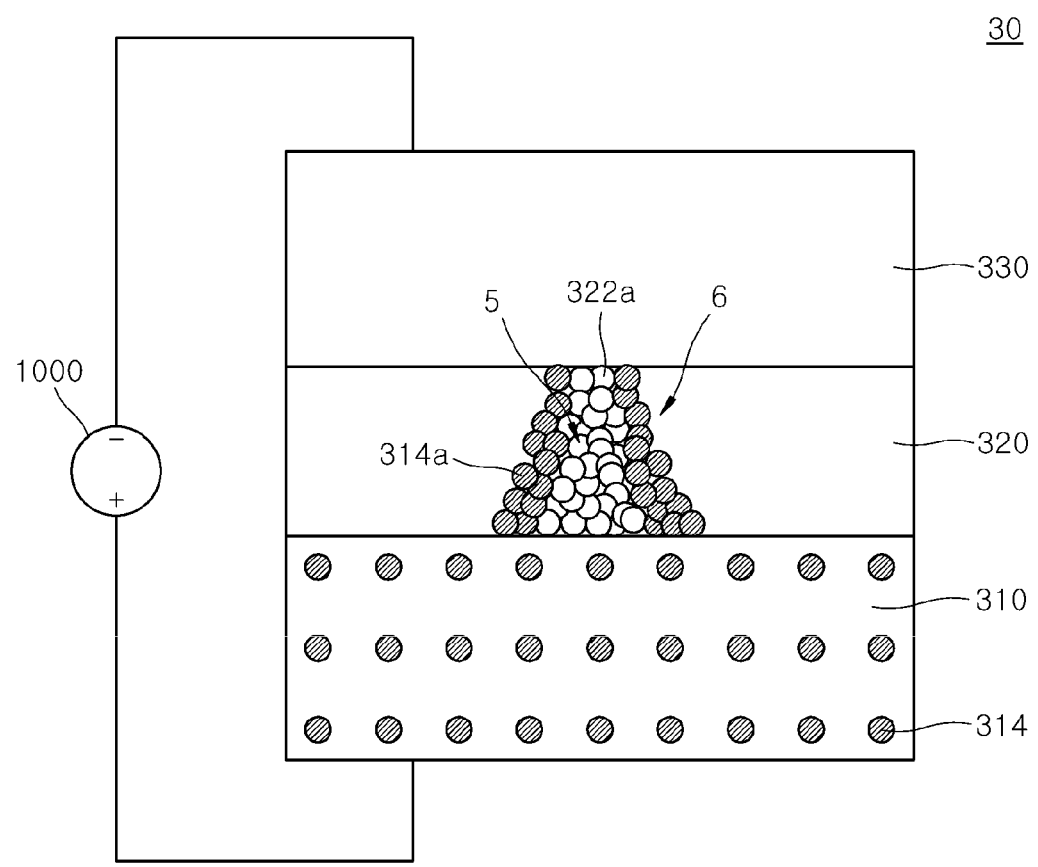

FIG. 8 is a view illustrating a resistive random access memory device 30 according to a third embodiment of the present disclosure. FIGS. 9 and 10 are views illustrating an operating method of the resistive random access memory device 30 according to the third embodiment of the present disclosure.

Referring to FIGS. 8 to 10, the resistive random access memory device 30 may include a first electrode 310, a second electrode 330, and an electrolyte layer 320 disposed between the first electrode 310 and the second electrode 330. In an embodiment, the first electrode 310, the electrolyte layer 320, and the second electrode 330 may constitute a unit cell of the resistive random access memory device 30.

In this embodiment, configurations of the first electrode 310 and the electrolyte layer 320 of the resistive random access memory device 30 are different from the configurations of the resistive random access memory device 10 according to the first embodiment. The electrolyte layer 320 may include first metal ions 322a. The first metal ions 322a may be provided in advance in the electrolyte layer 320 before the resistive random access memory device 30 operates. For example, the first metal ions 322a may be injected when forming the electrolyte layer 320, or may be injected into the electrolyte layer 320 after forming the electrolyte layer 320 through a separate process from a process of forming the electrolyte layer 320. Meanwhile, the first electrode 310 may include metal elements 314 that provide second metal ions 314a.

Referring to FIG. 9, when an external voltage is applied, the first metal ions 322a in the electrolyte layer 320 may be arranged across the electrolyte layer 320 in a direction from the first electrode 310 to the second electrode 330. Also, the second metal ions 314a may be provided from the first electrode 310 into the electrolyte layer 320. At this time, the first metal ions 322a may be arranged quicker than the second metal ions 314a across the electrolyte layer 320 in the form of a cluster of ions or in the form of metal atoms.

When the externally applied voltage increases and reaches a first threshold voltage, the first metal ions 322a provided in advance in the electrolyte layer 320 may form a first conductive bridge 5 in the form of a cluster of the first metal ions 322a or in the form of metal atoms reduced from the first metal ions 322a. The second metal ions 314a cannot yet form a conductive bridge at the first threshold voltage. As the first conductive bridge 5 is formed, a resistance value of the electrolyte layer 320 may be reduced, and thus a resistance state of the electrolyte layer 320 may be changed from an initial high resistance state to a first low resistance state.

Referring to FIG. 10, when the externally applied voltage increases beyond the first threshold voltage and reaches a second threshold voltage, the second metal ions 314a provided from the first electrode 310 may form a second conductive bridge 6 in the form of a cluster of the second metal ions 314a or in the form of metal atoms reduced from the second metal ions 314a in the electrolyte layer 320. As the second conductive bridge 6 is formed, the resistance value of the electrolyte layer 320 may be additionally reduced, and thus the resistance state of the electrolyte layer 320 may be changed from the first low resistance state to a second low resistance state.

According to some embodiments, the mobility of the first metal ion 322a, which is provided in advance in the electrolyte layer 320, may be greater than the mobility of the second metal ion 314a in the electrolyte layer 320. In addition, in the present embodiment, when the first metal ions 322a are provided in advance in the electrolyte layer 320, the first threshold voltage at which the first conductive bridge 5 is formed may be further reduced compared to the above embodiments illustrated in FIGS. 2-7. As a result, a voltage difference between the second threshold voltage at which the second conductive bridge 6 is formed and the first threshold voltage may be additionally increased. Accordingly, when performing a writing operation or a read operation for a plurality of resistance values, a writing or reading margin of the applied external voltage may be improved.

In the embodiment shown in FIGS. 8-10, the first electrode 310 includes the metal elements 314 that provide only the second metal ions 314a, but embodiments are not limited thereto. In other embodiments, the first electrode 310 may include two or more kinds of metal elements that provide two or more kinds of metal ions to the electrolyte layer 320, and may further include a chalcogenide element, as described with reference to FIGS. 1-7. As a result, it is possible to further increase the number of bits stored in a unit cell of a resistive random access memory device according to the embodiment shown in FIGS. 8-10.

Figure 11:
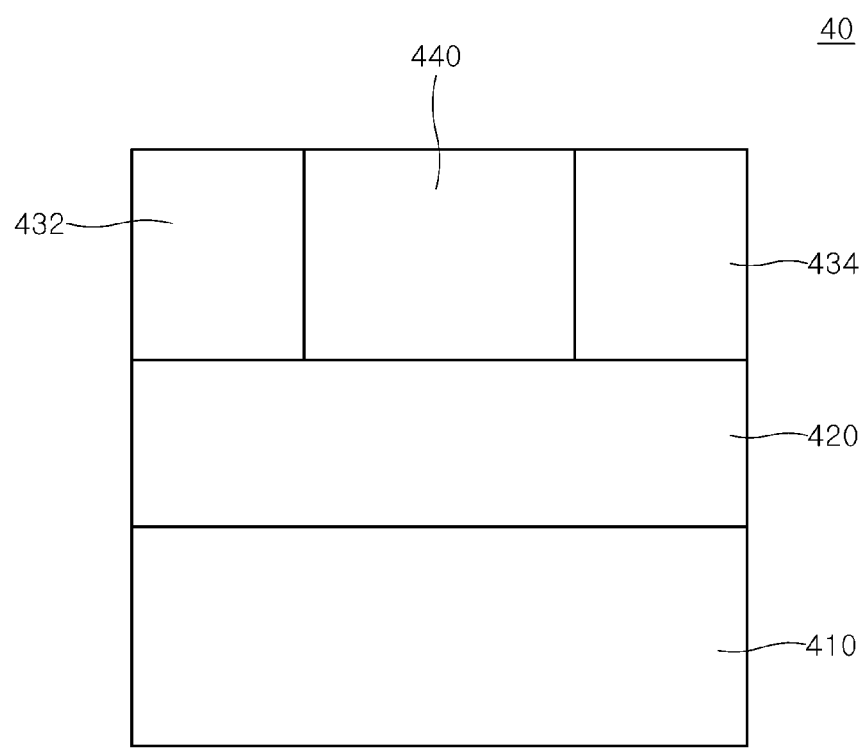
FIG. 11 is a view illustrating a resistive random access memory device according to a fourth embodiment of the present disclosure.
Figure 12:
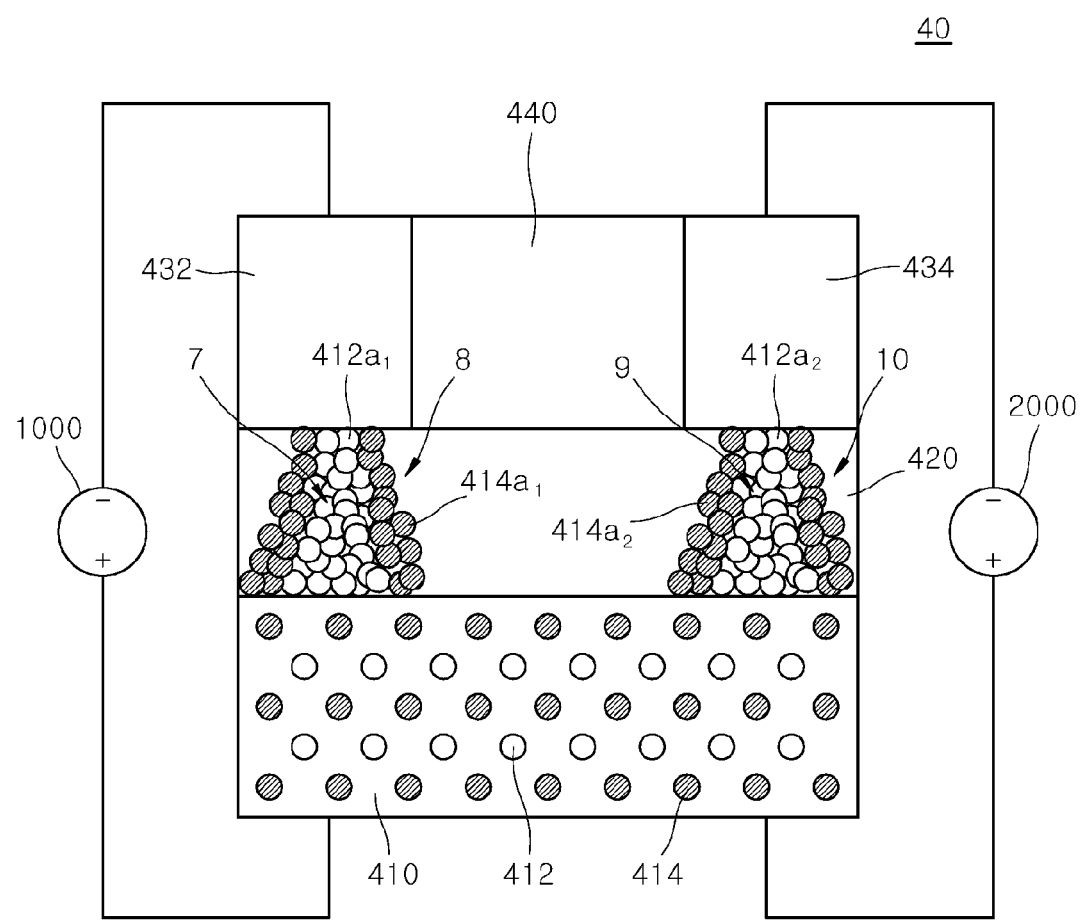
FIG. 12 is a view illustrating an operating method of the resistive random access memory device according to the fourth embodiment of the present disclosure.

FIG. 11 is a view illustrating a resistive random access memory device 40 according to a fourth embodiment of the present disclosure. FIG. 12 is a view illustrating an operating method of the resistive random access memory device 40 according to the fourth embodiment of the present disclosure.

Referring to FIGS. 11 and 12, the resistive random access memory device 40 may include a first electrode 410, a second electrode including two layers 432 and 434, and an electrolyte layer 420 disposed between the first electrode 410 and the second electrode 432 and 434. In an embodiment, the first electrode 410, the electrolyte layer 420, and the second electrode 432 and 434 may constitute a unit cell of the resistive random access memory device 40. The first electrode 410 may include an ion supply layer. The second electrode 432 and 434 may be a counter electrode with respect to the first electrode 410.

A configuration of the second electrode 432 and 434 of the resistive random access memory device 40 is different from the configuration of the second electrode 130 of the resistive random access memory device 10 according to the first embodiment. In the resistive random access memory device 40, the second electrode 432 and 434 includes a plurality of sub-electrode layers, e.g., the two sub-electrode layers 432 and 434 spaced apart from each other on the same plane.

In FIG. 11, although the second electrode is composed of the first sub-electrode layer 432 and the second sub-electrode layer 434, which are spaced apart from each other, embodiments are not limited thereto. The number of the sub-electrode layers is not limited to two. In addition, the second electrode may further include a plurality of conductive layers that are stacked on the first and second sub-electrode layers 432 and 434.

The first sub-electrode layer 432 and the second sub-electrode layer 434 may contact different regions of the electrolyte layer 420. In FIG. 11, an insulation layer 440 may be disposed between the first sub-electrode layer 432 and the second sub-electrode layer 434. More specifically, the insulation layer 440 may be disposed to fill a space between the first sub-electrode layer 432 and the second sub-electrode layer 434 on the same plane as a plane on which the first sub-electrode layer 432 and the second sub-electrode layer 434 are disposed. That is, the first sub-electrode layer 432, the insulation layer 440, and the second sub-electrode layer 434 are laterally disposed on the same plane. Accordingly, the insulation layer 440 may electrically insulate the first sub-electrode layer 432 from the second sub-electrode layer 434.

Referring to FIG. 12, voltages may be applied to the resistive random access memory device 40 from power supplies 1000 and 2000. The power supplies 1000 and 2000 may be external power supply devices that are separate from each other. Alternatively, the power supplies 1000 and 2000 may be power generation circuits disposed in the resistive random access memory device 40, and may receive a voltage from the same external power supply, but generate internal voltages differently.

A first conductive bridge 7 and a second conductive bridge 8 may be formed in sequence when the first power supply 1000 applies a first voltage between a first region of the first electrode 410 and the first sub-electrode layer 432. The first region of the first electrode 410 may be a region overlapping the first sub-electrode layer 432. Further, a third conductive bridge 9 and a fourth conductive bridge 10 may be formed in sequence when the second power supply 200 applies a second voltage between a second region of the first electrode 410 and the second sub-electrode layer 434. The second region of the first electrode 410 may be a region overlapping the second sub-electrode layer 434.

In an embodiment, the first electrode 410 may include first and second metal elements 412 and 414. The first metal element 412 may be oxidized into first metal ions $412a_1$ and $412a_2$ and provided to the electrolyte layer 420. The second metal element 414 may be oxidized into second metal ions $414a_1$ and $414a_2$ and provided to the electrolyte layer 420. Configurations of the first and second metal elements 412 and 414 and the first and second metal ions $412a_1$ (or $412a_2$) and $414a_1$ (or $414a_2$) are substantially the same as the configurations of the first and second metal elements 112 and 114 and the first and second metal ions 112a and 114a of the first embodiment, respectively. Also, an operation of forming the first and second conductive bridges 7 and 8 using a first voltage and an operation of forming the third and fourth conductive bridges 9 and 10 using a second voltage are each substantially the same as the operation of forming the first and second conductive bridges 1 and 2 of the first embodiment.

In the present embodiment, an operation of applying the first voltage between the first region of the first electrode 410 and the first sub-electrode layer 432 and an operation of applying the second voltage between the second region of the first electrode 410 and the second sub-electrode layer 434 may be performed independently from each other. For example, the first to fourth conductive bridges 7 to 10 may be formed in sequence by controlling the magnitude of the first and second voltages and controlling when the first and second voltages are applied. At this time, locations where the first and second conductive bridges 7 and 8 and the third and fourth conductive bridges 9 and 10 are formed may be determined depending on locations of the first sub-electrode layer 432 and the second sub-electrode layer 434.

The resistance value of the electrolyte layer 420 may be decreased as the number of conductive bridges formed in the electrolyte layer 420 is increased. As a result, compared to the first embodiment, the number of resistance levels implemented in the electrolyte layer 420 may be increased by controlling points of time at which the first voltage and the second voltage are applied. In other words, the bit number of data stored in a unit cell of a nonvolatile resistive random access memory device can be additionally increased.

In FIGS. 11 and 12, the configurations of the first electrode 410 and the electrolyte layer 420 are substantially the same as the configurations of the first electrode 110 and the electrolyte layer 120 of the first embodiment, but embodiments are not limited thereto. In some other embodiments, the configurations of the first electrode 410 and the electrolyte layer 420 may be substantially the same as the configurations of the first electrode and the electrolyte layer of one of the second embodiment and the third embodiment.

In FIGS. 11 and 12, the first electrode 410 includes a single ion supply layer, and the second electrode, which is a counter electrode of the first electrode 410, includes the first and second sub-electrode layers 432 and 434. However, embodiments are not limited thereto. In some other embodiments, the first electrode 410 may have a plurality of sub-electrode layers. In this case, the ion supply layer may be divided into a plurality of sub-ion supply portions that are laterally disposed and spaced apart from each other on the same plane.

Figure 13:
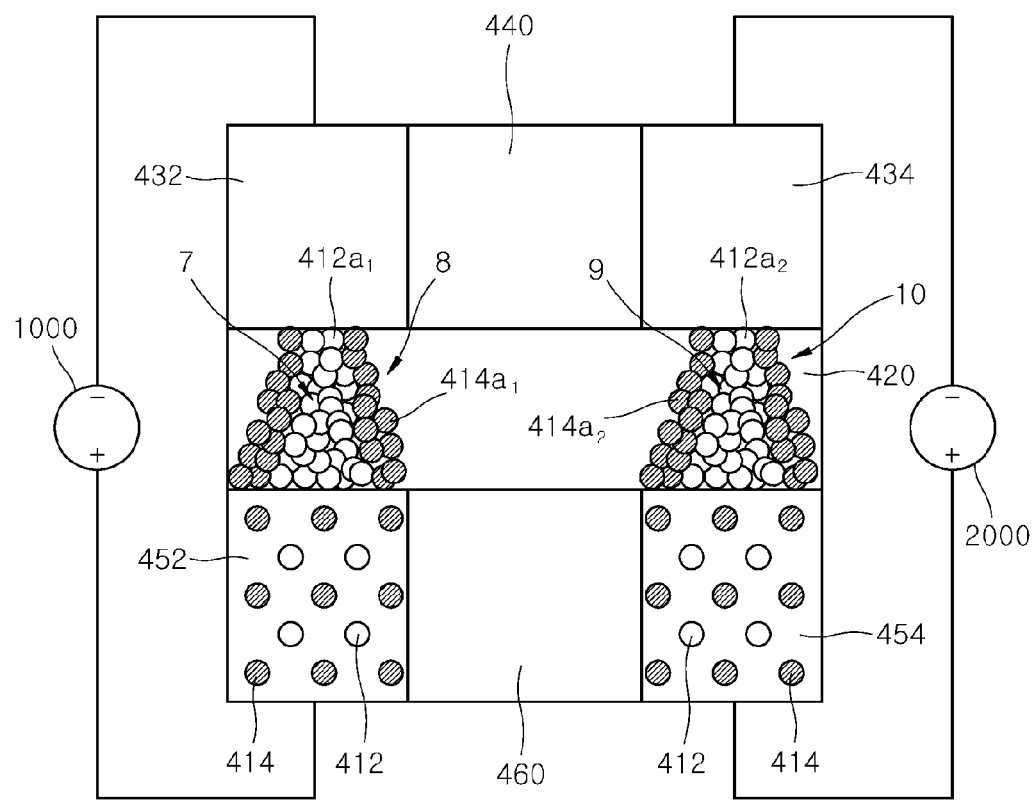
FIG. 13 is a view illustrating a resistive random access memory device according to a fifth embodiment of the present disclosure and an operation method thereof.

FIG. 13 is a view illustrating a resistive random access memory device 50 according to a fifth embodiment of the present disclosure and an operation method thereof. The resistive random access memory device 50 according to the fifth embodiment may have a configuration in which the first electrode 410 of the resistive random access memory device 40 according to the fourth embodiment is replaced with a third sub-electrode layer 452, an insulation layer 460, and a fourth sub-electrode layer 454. The third sub-electrode layer 452, the insulation layer 460, and the fourth sub-electrode layer 454 are laterally disposed on the same plane.

In the present embodiment, an operation of applying the first voltage between the first sub-electrode layer 432 and the third sub-electrode layer 452, and an operation of applying the second voltage between the second sub-electrode layer 434 and the fourth sub-electrode layer 454 may be performed independently from each other.

For example, the first to fourth conductive bridges 7 to 10 may be formed in sequence by controlling the magnitude of the first and second voltages when the first and second voltages are applied. At this time, the first and second conductive bridges 7 and 8 are formed between the first sub-electrode layer 432 and the third sub-electrode layer 452, and the third and fourth conductive bridges 9 and 10 are formed between the second sub-electrode layer 434 and the fourth sub-electrode layer 454.

Figure 14:
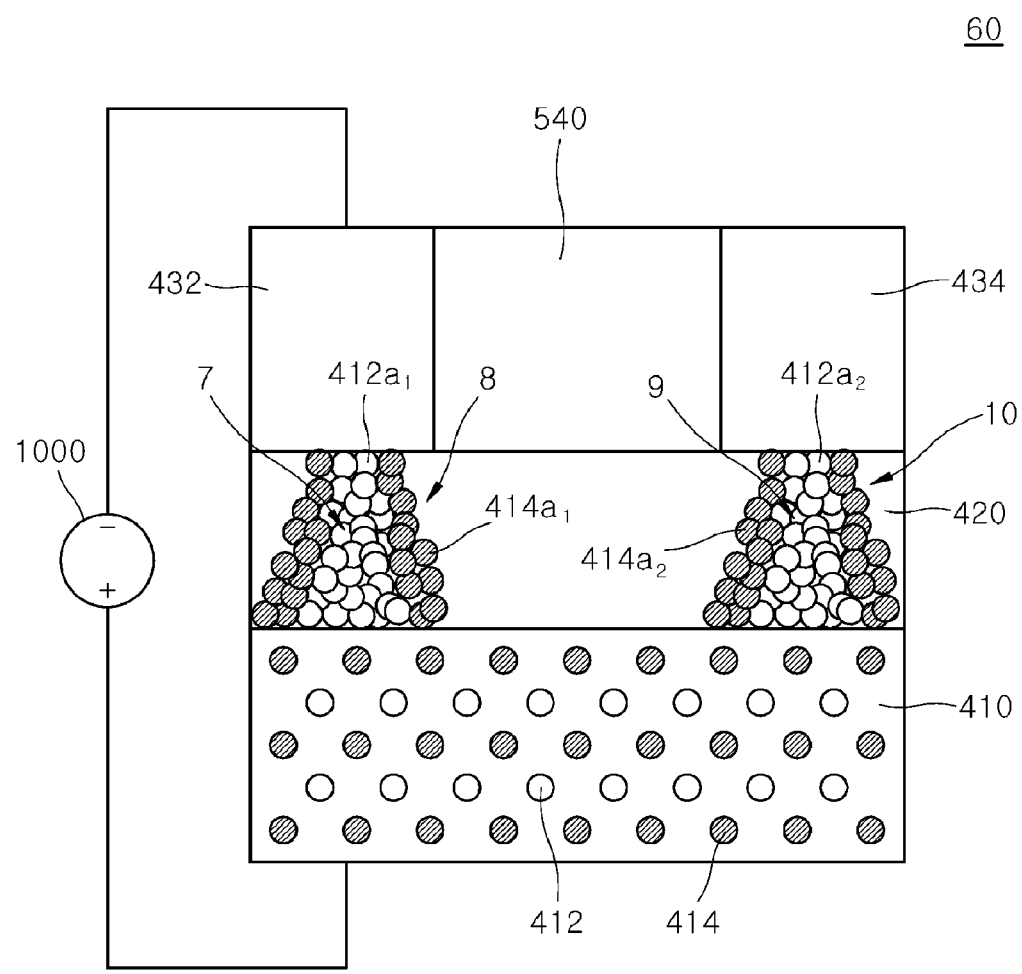
FIG. 14 is a view illustrating a resistive random access memory device according to a sixth embodiment of the present disclosure and an operation method thereof.

FIG. 14 is a view illustrating a resistive random access memory device 60 according to a sixth embodiment of the present disclosure and an operation method thereof. The resistive random access memory device 60 according to the sixth embodiment may have a configuration in which the insulation layer 440 of the resistive random access memory device 40 according to the fourth embodiment is replaced with a resistance layer 540.

When a first voltage is applied between a first electrode 410 and a first sub-electrode layer 432, the resistance layer 540 may generate a voltage drop from the first sub-electrode layer 432 to the second sub-electrode layer 434.

The resistance layer 540 may be formed of a material having an internal resistance value that can produce a predetermined voltage drop without any limitations in the material. A variety of known materials such as an oxide material, a nitride material, an oxy-nitride material, or the like may be employed in the resistance layer 540.

When the first voltage is applied between the first electrode 410 and the first sub-electrode layer 432, a voltage applied between the second sub-electrode layer 434 and the first electrode 410 may be lower than a voltage applied between the first sub-electrode layer 432 and the first electrode 410, due to the voltage drop caused by the resistance layer 540. Accordingly, as a level of the first voltage is sequentially increased, third and fourth conductive bridges 9 and 10 may be generated between the second sub-electrode layer 434 and the first electrode 410 after first and second conductive bridges 7 and 8 are generated between the first sub-electrode layer 432 and the first electrode 410.

A resistance value of the resistance layer 540 may be determined in consideration of threshold voltages at which the first and second conductive bridges 7 and 8 are generated and threshold voltages at which the third and fourth conductive bridges 9 and 10 are generated.

A resistance value of the electrolyte layer 420 may be decreased as the number of conductive bridges formed in the electrolyte layer 420 is increased. In the present embodiment, a plurality of resistance levels can be implemented in the electrolyte layer 420 by controlling generation times of the third and fourth conductive bridges 9 and 10 using the resistance layer 540. In other words, the number of bits stored in a unit cell of a nonvolatile resistive random access memory device can be increased based on the number of conductive bridges that can be formed in the electrolyte layer 420.

According to the above-described embodiments, a resistive random access memory device in which two or more conductive bridges are formed in an electrolyte layer at different threshold voltages when a voltage is applied from outside can be provided. As a resistance variation is generated in the electrolyte layer by the two or more conductive bridges, the resistive random access memory device can implement a plurality of resistance levels in a unit cell. Through this, the resistive random access memory device can store a data signal having a plurality of bits in a unit cell.

The embodiments of the inventive concept have been disclosed above for illustrative purposes. Those of ordinary skill in the art will appreciate that various modifications, additions and substitutions are possible, without departing from the scope and spirit of the inventive concept as disclosed in the accompanying claims.

What is claimed is:

1. A resistive random access memory device comprising:
   a first electrode and a second electrode; and
   an electrolyte layer disposed between the first electrode and the second electrode, wherein one of the first electrode and the second electrode comprises an ion supply layer providing two or more kinds of metal ions to the electrolyte layer, wherein the electrolyte layer comprises a first conductive bridge generated at a first threshold voltage, the first conductive bridge including one kind of a metal ion selected from the two or more kinds of metal ions, wherein the electrolyte layer comprises a second conductive bridge in addition to the first conductive bridge, the second conductive bridge being generated at a second threshold voltage that is higher than the first threshold voltage, the second conductive bridge including another kind of a metal ion selected from the two or more kinds of metal ions, wherein the electrolyte layer has a first low resistance state when the electrolyte layer comprises the first conductive bridge only, and the electrolyte layer has a second low resistance state when the electrolyte layer comprises the first and the second conductive bridges, wherein a resistance value of the second low resistance state is different from a resistance value of the first low resistance state, and wherein the second conductive bridge is generated to surround at least a portion of the first conductive bridge so that the first conductive bridge is in contact with the second conductive bridge.

2. The resistive random access memory device of claim 1, wherein two or more conductive bridges are sequentially generated at different threshold levels of a voltage externally applied between the first and second electrodes.

3. The resistive random access memory device of claim 1, wherein the ion supply layer comprises a binary alloy including two different kinds of metal elements.

4. The resistive random access memory device of claim 3, wherein the binary alloy comprises one selected from silver-copper, copper-aluminum, copper-titanium, copper-nickel, silver-aluminum, silver-titanium, and silver-nickel.

5. The resistive random access memory device of claim 4, wherein the ion supply layer further comprises a chalcogenide element.

6. The resistive random access memory device of claim 5, wherein a first kind of the metal elements in the binary alloy has a greater coupling force with the chalcogenide element than a second kind of the metal elements.

7. The resistive random access memory device of claim 6, wherein the chalcogenide element suppresses a diffusion of the first kind of the metal elements into the electrolyte layer.

8. The resistive random access memory device of claim 1, wherein the electrolyte layer comprises an oxide material or a chalcogenide group compound.

9. The resistive random access memory device of claim 8, wherein the electrolyte layer comprises one or more selected from a silicon oxide material, an aluminum oxide material, a titanium oxide material, a tantalum oxide material, a copper oxide material, a zirconium oxide material, a gadolinium oxide material, a GeS material, a GeTe material, a GeTeAs material, a GeSe material, a CuS material, a CuSe material, a CuTe material, and a CuTeAs material.

10. The resistive random access memory device of claim 1, wherein a plurality of resistance levels are implemented in the electrolyte layer by two or more conductive bridges.

* * * * *